(12) United States Patent
Lee et al.

(10) Patent No.: US 10,818,519 B2
(45) Date of Patent: Oct. 27, 2020

(54) APPARATUS AND METHOD FOR TREATING SUBSTRATE

(71) Applicant: SEMES CO., LTD., Chungcheongnam-do (KR)

(72) Inventors: Yong Hee Lee, Cheonan-si (KR); Young Hun Lee, Cheonan-si (KR)

(73) Assignee: SEMES CO., LTD., Chungcheongnam-Do (KR)

(*) Notice: Subject to any disclaimer, the term of this patent is extended or adjusted under 35 U.S.C. 154(b) by 51 days.

(21) Appl. No.: 16/044,601

(22) Filed: Jul. 25, 2018

(65) Prior Publication Data

US 2019/0035648 A1 Jan. 31, 2019

(30) Foreign Application Priority Data

Jul. 25, 2017 (KR) .................. 10-2017-0094210

(51) Int. Cl.
*H01L 21/67* (2006.01)
*H01L 21/687* (2006.01)
*H01L 21/02* (2006.01)

(52) U.S. Cl.
CPC .. *H01L 21/67034* (2013.01); *H01L 21/02052* (2013.01); *H01L 21/02057* (2013.01); *H01L 21/02101* (2013.01); *H01L 21/6719* (2013.01); *H01L 21/68742* (2013.01); *H01L 21/68764* (2013.01)

(58) Field of Classification Search
None
See application file for complete search history.

(56) References Cited

U.S. PATENT DOCUMENTS 9,527,118 B2 * 12/2016 Lee .................. B08B 7/0021
2006/0289306 A1 * 12/2006 Kim .................. C23C 14/50
204/298.16
2013/0061492 A1 3/2013 Okuchi et al.

FOREIGN PATENT DOCUMENTS

| CN | 1361169 A | | 7/2002 | |
|---|---|---|---|---|
| CN | 101361169 A | * | 2/2009 | ....... H01L 21/67028 |
| CN | 103456665 A | | 12/2013 | |
| CN | 105590836 A | | 5/2016 | |
| CN | 106158707 A | | 11/2016 | |
| JP | 4546314 B2 | | 7/2010 | |
| JP | 2013-062417 A | | 4/2013 | |
| KR | 10-2008-0073370 A | | 8/2008 | |
| KR | 10-2011-0101045 A | | 9/2011 | |
| KR | 10-2013-0009554 A | | 1/2013 | |

(Continued)

OTHER PUBLICATIONS

EPO translation of KR 101394456 (Year: 2020).*
EPO translation of CN101361169 (Year: 2020).*

*Primary Examiner* — Eric W Golightly
(74) *Attorney, Agent, or Firm* — Li & Cai Intellectual Property (USA) Office

(57) ABSTRACT

Disclosed are an apparatus and a method for drying a substrate. The apparatus for drying a substrate includes a chamber having a treatment space in the interior thereof, a substrate support unit configured to the substrate in the treatment space, a conversion unit configured to convert a state of the substrate supported by the substrate support unit between a horizontal state and an inclined state, a fluid supply unit configured to supply a drying fluid into the treatment space, and a controller configured to control the conversion unit and the fluid supply unit.

7 Claims, 12 Drawing Sheets

(56) References Cited

FOREIGN PATENT DOCUMENTS

| KR | 10-2013-0035840 A | 4/2013 |
| KR | 10-2016-0053337 A | 5/2016 |

* cited by examiner

APPARATUS AND METHOD FOR TREATING SUBSTRATE

CROSS-REFERENCE TO RELATED APPLICATIONS

This application claims priority under 35 U.S.C. § 119 to Korean Patent Application No. 10-2017-0094210 filed on Jul. 25, 2017, in the Korean Intellectual Property Office, the disclosures of which are incorporated by reference herein in their entireties.

BACKGROUND

Embodiments of the inventive concept described herein relate to an apparatus and a method for treating a substrate.

In order to manufacture a semiconductor device, a desired pattern is formed on a substrate through various processes such as, photographing, etching, ashing, ion injection, and deposition of thin films. Various treatment liquids are used in the processes, and contaminants and particles are generated during the process. In order to solve this, a cleaning process for cleaning contaminants and particles is essentially performed before and after the process.

In general, the cleaning process includes a liquid treating process and a drying process. In the liquid treating process, a substrate is treated with a chemical and a rinsing liquid. In the drying process, a liquid that stays on the substrate is removed. In recent years, substrates have been dried by using a supercritical fluid having low surface tensions to prevent the patterns on the substrate from being collapsed.

Because the substrate drying process using a supercritical fluid is performed in a chamber of a high pressure, the liquid treating process and the drying process are performed in different chambers. If the liquid that stays on the substrate before the substrate is carried into the drying chamber is naturally dried, a process defect is generated. To prevent this, a sufficiently large amount of a liquid stays on a substrate before the substrate is carried into the drying chamber in the liquid treating process.

However, because a large amount of a liquid that stays on a substrate has to be removed from the drying chamber with a supercritical fluid, a long time is taken in the drying process.

PRIOR TECHNICAL DOCUMENTS

Patent Documents

Korean Patent Application Publication No. 2011-0101045

SUMMARY

Embodiments of the inventive concept provide an apparatus and a method for promptly performing a process of drying a substrate even when a sufficiently large amount of a liquid stays on the substrate.

The inventive concept provides an apparatus and a method for drying a substrate. In accordance with an aspect of the inventive concept, there is provided an apparatus for drying a substrate, the apparatus including a chamber having a treatment space in the interior thereof, a substrate support unit configured to support the substrate in the treatment space, a conversion unit configured to convert a state of the substrate supported by the substrate support unit between a horizontal state and an inclined state, a fluid supply unit configured to supply a drying fluid into the treatment space, and a controller configured to control the conversion unit and the fluid supply unit.

The controller may control the conversion unit and the fluid supply unit to perform a first liquid removing operation of allowing a part of a liquid that stays on the substrate to flow down from the substrate by converting the state of the substrate to an inclined state if the substrate is carried into the substrate support unit in the treatment space, and a second liquid removing operation of allowing the remaining part of the liquid that stays on the substrate to be removed by the drying fluid, by supplying the drying fluid into the treatment space. The drying fluid may be supplied in a supercritical state in the treatment space in the second liquid removing operation. The substrate may be provided in a horizontal state in the second liquid removing operation. The controller may control the fluid supply unit to further perform an atmosphere forming operation of forming the treatment space into a supercritical atmosphere by supplying the drying fluid into the treatment space before the first liquid removing operation, and the drying fluid may be in a supercritical state in the treatment space in the atmosphere forming operation.

The conversion unit may convert a state of the substrate by changing a state of the chamber between the horizontal state and the inclined state. The substrate support unit may include a plurality of substrates, and the substrate support unit may include a plurality of vertical supports that extend downwards from a ceiling surface of the chamber, and a plurality of horizontal supports that extend inwards from the vertical supports and is located at different heights to support the substrate, respectively.

The conversion unit may convert the state of the substrate between the horizontal state and the inclined state by generating a magnetic force. The conversion unit may include a guide located in the substrate support unit and configured to support one side of the substrate, an upper magnetic member provided in the guide, and a lower magnetic member provided in the chamber and located below the upper magnetic member, and the guide may be elevated by a magnetic force generated between the upper magnetic member and the lower magnetic member.

In accordance with another aspect of the inventive concept, there is provided a method for drying a substrate, the method including an operation of carrying the substrate into a treatment space formed in a chamber, and an operation of drying the substrate in a state in which the treatment space is sealed, and the operation of drying the substrate may include a first liquid removing operation of allowing a part of a liquid that stays on the substrate to flow down from the substrate by converting a state of the substrate into an inclined state, and a second liquid removing operation of allowing the remaining part of the liquid that stays on the substrate to be removed by supplying a drying fluid into the treatment space.

The substrate may be provided in a horizontal state in the second liquid removing operation. The drying fluid may be in a supercritical state in the treatment space in the second liquid removing operation. The method may further include an atmosphere forming operation of forming the treatment space into a supercritical atmosphere by supplying the drying fluid into the treatment space before the first liquid removing operation, and the drying fluid may be supplied in a supercritical state in the treatment space in the atmosphere forming operation. The method may further include a liquid treating operation of supplying a liquid onto the substrate in a liquid treating chamber before the operation of carrying the substrate.

The state of the substrate may be converted by changing a state of the chamber into the horizontal state and the inclined state. A plurality of substrates may be located in the treatment space.

The state of the substrate may be converted between the inclined state and the horizontal state.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
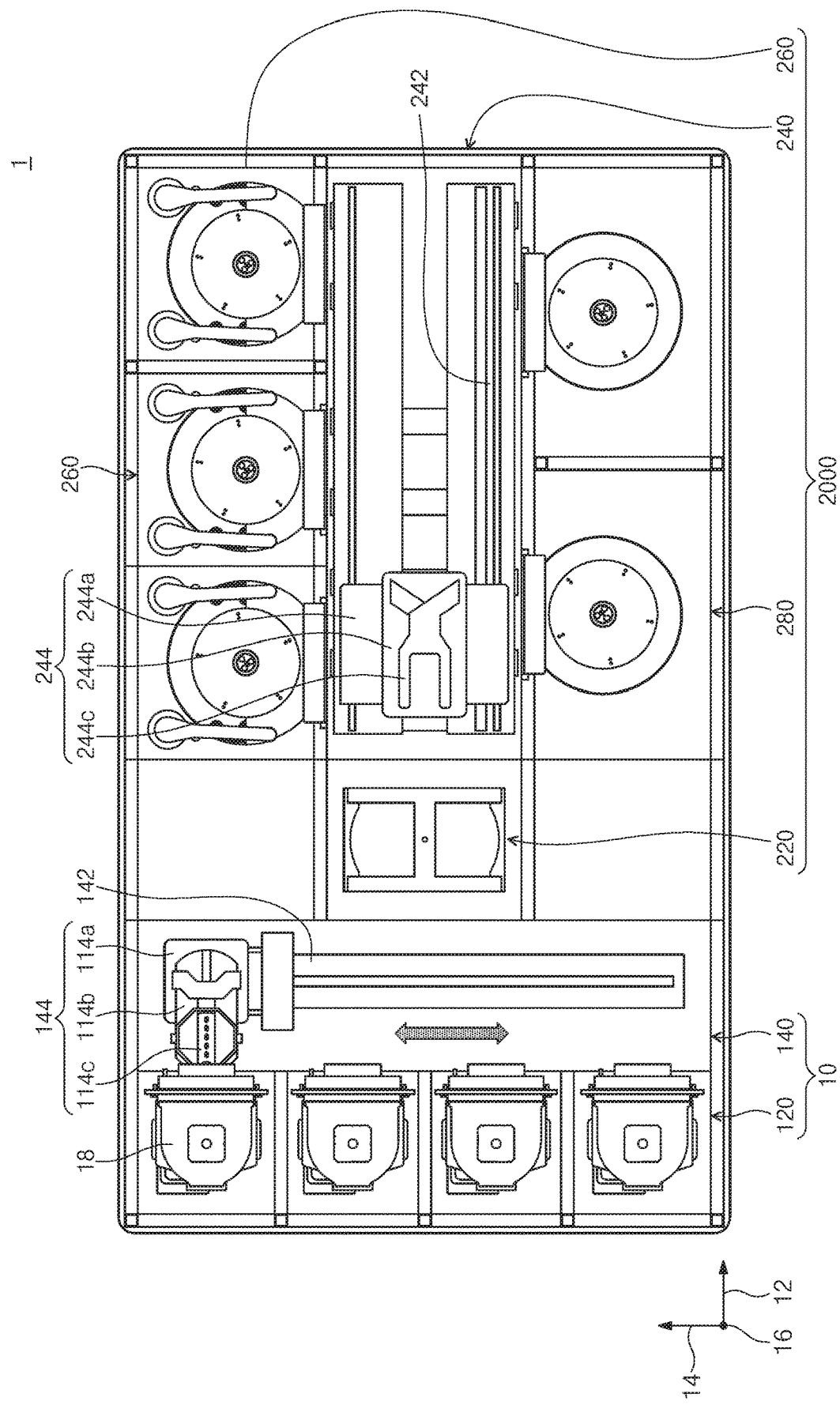
FIG. 1 is a plan view schematically illustrating a substrate treating system according to an embodiment of the inventive concept.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

An embodiment of the inventive concept will be described with reference to FIGS. 1 to 12.

FIG. 1 is a plan view illustrating a substrate treating system according to a first embodiment of the inventive concept.

Referring to FIG. 1, the substrate treating system 1 has an index module 10 and a process treating module 20, and the index module 100 includes a plurality of load ports 120 and a feeding frame 140. The load ports 120, the feeding frame 140, and the process treating module 20 may be sequentially arranged in a row. Hereinafter, a direction in which the load ports 120, the feeding frame 140, and the process treating module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18, in which a substrate W is received, is seated on the load port 120. A plurality of load ports 120 are provided, and are arranged along the second direction 14 in a row. FIG. 1 illustrates that four load ports 120 are provided. However, the number of the load ports 120 may increase or decrease according to a condition, such as the process efficiency of the process treating module 20 or a footprint. A plurality of slots (not illustrated) provided to support peripheries of substrates are formed in the carrier 18. A plurality of slots are provided along the third direction 16, and the substrate is situated in the carrier 130 such that the substrates are stacked to be spaced apart from each other along the third direction 16. A front opening unified pod (FOUP) may be used as the carrier 18.

The process treating module 20 includes a buffer unit 220, a feeding chamber 240, a first process chamber 260, and a second process chamber 280. The feeding chamber 240 is disposed such that the lengthwise direction thereof is in parallel to the first direction 12. The first process chambers 260 are disposed on one side of the feeding chamber 240 along the second direction, and the second process chambers 280 are disposed on an opposite side of the feeding chamber 240. The first process chambers 260 and the second process chambers 280 may be arranged to be symmetrical to each other with respect to the feeding chamber 240. Some of the first process chambers 260 are arranged along the lengthwise direction of the transfer chamber 240. Furthermore, some of the first process chambers 260 are arranged to be stacked on each other. That is, the first process chambers 260 having an array of A by B (A and B are natural numbers) may be arranged on one side of the transfer chamber 240. Here, A is the number of the second process chambers 260 provided in a row along the first direction 12, and B is the number of the first process chambers 260 provided in a row along the third direction 16. When four or six first process chambers 260 are provided on one side of the feeding chamber 240, the first process chambers 260 may be arranged in an array of 2 by 2 or 3 by 2. The number of the first process chambers 260 may increase or decrease. Similarly to the first process chambers 260, the second process chambers 280 may be arranged in an array of M by N (M and N are natural numbers). Here, M and N may be same numbers as A and B. Unlike the above description, the first process chambers 260 and the second process chambers 280 may be provided only on one side of the feeding chamber 240. Further, unlike the above description, the first process chambers 260 and the second process chambers 280 may be provided on opposite sides of the feeding chamber 500 in a single layer. Further, unlike the above description, the first process chambers 260 and the second process chambers 280 may be provided in various arrangements.

The buffer unit 220 is disposed between the feeding frame 140 and the feeding chamber 240. The buffer unit 220 provides a space in which the substrates W stay before being transported, between the feeding chamber 240 and the feeding frame 140. Slots (not illustrated) in which the substrates W is positioned are provided in the buffer unit 220, and a plurality of slots (not illustrated) are provided to be spaced apart from each other along the third direction 16. A face of the buffer unit 220 that faces the feeding frame 140 and a face of the buffer unit 220 that faces the feeding chamber 240 are opened.

The feeding frame 140 transports the substrates W between the carrier 18 seated on the load port 120 and the buffer unit 220. An index rail 142 and an index robot 144 are provided in the feeding frame 140. The index rail 142 is provided such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are disposed to be stacked so as to be spaced apart from each other along the third direction 16. Some of the index arms 144c are used when the substrates W are transported to the carrier 18 in the process module 20, and some of the index arms 144c may be used when the substrates W are transported from the carrier 18 to the process treating module 20. This structure may prevent particles generated from the substrates W before the process treatment from being attached to the substrates W after the process treatment in the process of carrying the substrates W in and out by the index robot 144.

The transfer chamber 240 transfers the substrate W between any two of the buffer unit 220, the first process chambers 260, and the second process chambers 280. A guide rail 242 and a main robot 244 are provided in the feeding chamber 240. The guide rail 242 is disposed such that the lengthwise direction thereof is parallel to the first direction 12. The main robot 244 is installed on the guide rail 242, and is linearly moved along the first direction 12 on the index rail 242.

The first process chamber 260 and the second process chamber 280 may sequentially perform a process on one substrate W. For example, the substrate W may perform a chemical process, a rinsing process, and a solvent supplying process in the first process chamber 260, and may perform a drying process in the second process chamber 260. In this case, the solvent supplying process may be performed by an organic solvent, and the drying process may be performed by a supercritical fluid. An isopropyl alcohol (IPA) liquid may be used as an organic solvent, and carbon dioxide ($CO_2$) may be used as a supercritical fluid.

Figure 2:
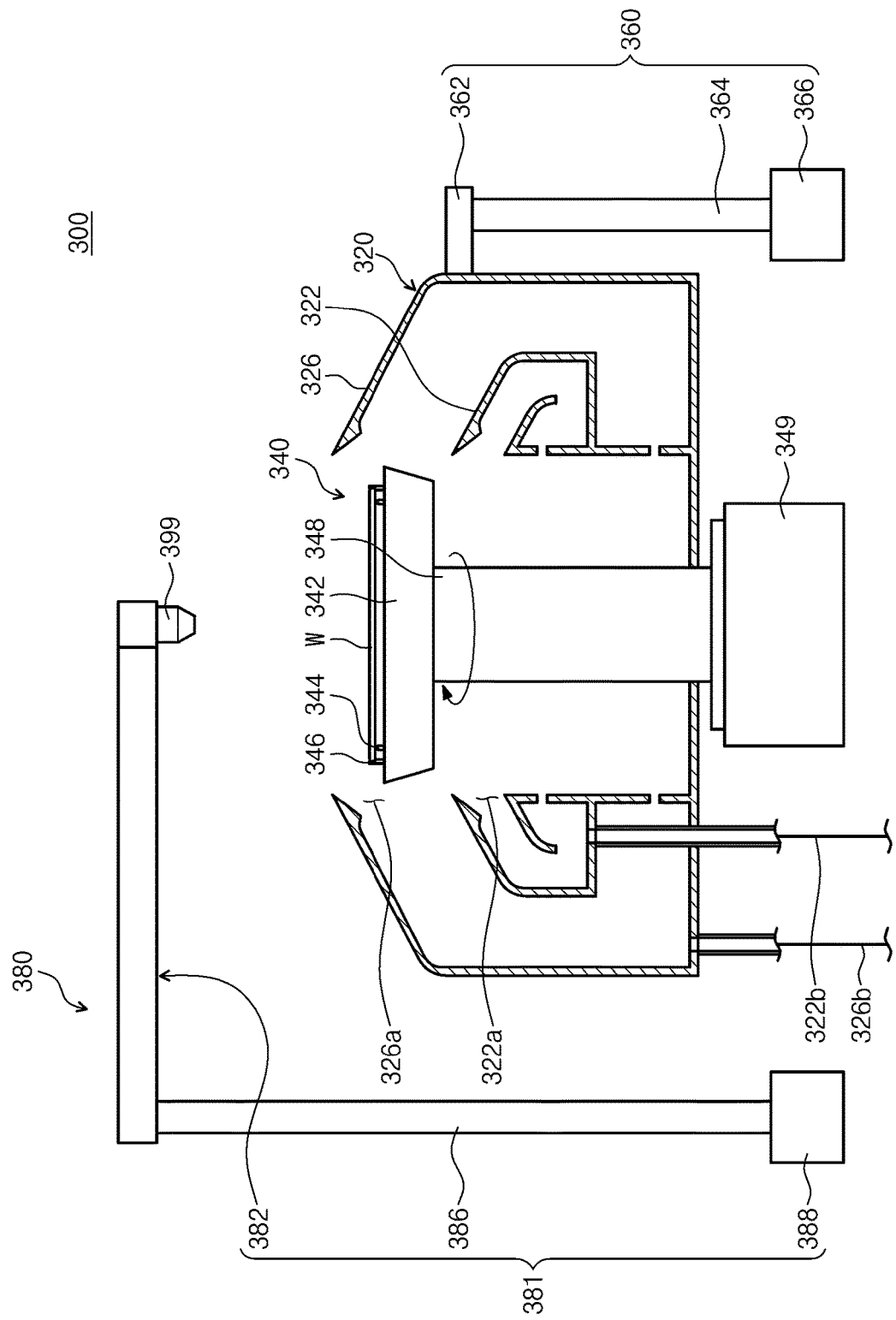
FIG. 2 is a sectional view schematically illustrating an apparatus for cleaning a substrate in a first process chamber of FIG. 1.

Hereinafter, a substrate treating apparatus 300 provided in the first process chamber 260 will be described. FIG. 2 is a sectional view illustrating an apparatus for cleaning a substrate in a first process chamber of FIG. 1. Referring to FIG. 2, the substrate treating apparatus 300 includes a treatment container 320, a spin head 340, an elevation unit 360, and an ejection member 380. The treatment container 320 provides a space in which a substrate treating process is performed, and an upper side of the treatment container 320 is opened. The treatment container 320 includes an inner recovery vessel 322 and an outer recovery vessel 326. The recovery vessels 322 and 326 recover different treatment liquids used in the process. The inner recovery vessel 322 is provided to have an annular ring shape that surrounds the spin head 340, and the outer recovery vessel 326 is provided to have an annular ring shape that surrounds the inner recovery vessel 322. An inner space 322a of the inner recovery vessel 322 and a space between the outer recovery vessel 326 and the inner recovery vessel 322 function as inlets, through which the treatment liquid is introduced into the inner recovery vessel 322 and the outer recovery vessel 326, respectively. Recovery lines 322b and 326b extending from the recovery vessels 322 and 326 perpendicularly in the downward direction of the bottom surfaces thereof are connected to the recovery vessels 322 and 326, respectively. The recovery lines 322b and 326b discharge the treatment liquids introduced through the recovery vessels 322 and 326, respectively. The discharged treatment liquids may be reused through an external treatment liquid recycling system (not illustrated).

The spin head 340 is arranged in the treatment container 320. The spin head 340 supports and rotates the substrate W during the process. The spin head 340 has a body 342, a plurality of support pins 334, a plurality of chuck pins 346, and a support shaft 348. The body 342 has an upper surface having a substantially circular shape when viewed from the top. The support shaft 348 that may be rotated by a motor 349 is fixedly coupled to the bottom of the body 342. A plurality of support pins 334 are provided. The support pins 334 may be arranged to be spaced apart from each other at a periphery of the upper surface of the body 342 and protrude upwards from the body 342. The support pins 334 are arranged to have a generally annular ring shape through combination thereof. The support pins 334 support a periphery of a rear surface of the substrate such that the substrate W is spaced apart from the upper surface of the body 342 by a predetermined distance. A plurality of chuck pins 346 are provided. The chuck pins 346 are arranged to be more distant from the center of the body 342 than the support pins 334. The chuck pins 346 are provided to protrude upwards from the body 342. The chuck pins 346 support a side of the substrate W such that the substrate W is not separated laterally from a proper place when the spin head 340 is rotated. The chuck pins 346 are provided to be linearly moved between a standby position and a support position along a radial direction of the body 342. The standby position is a position that is more distant from the center of the body 342 than the support position. When the substrate W is loaded on or unloaded from the spin head 340, the chuck pins 346 are located at the standby position, and when a process is performed on the substrate W, the chuck pins 346 are located at the support position. The chuck pins 346 are in contact with the side of the substrate W at the support position.

The elevation unit 360 linearly moves the container 320 upwards and downwards. When the container 320 is moved upwards and downwards, a relative height of the container 320 to the spin head 340 is changed. The elevation unit 360 has a bracket 362, a movable shaft 364, and a driver 366. The bracket 362 is fixedly installed on an outer wall of the container 320, and the movable shaft 364 that is moved upwards and downwards by the driver 366 is fixedly coupled to the bracket 362. The treatment container 320 is lowered such that, when the substrate W is positioned on the spin head 340 or is lifted from the spin head 340, the spin head 340 protrudes to the upper side of the treatment container 320. When the process is performed, the height of the container 320 is adjusted such that the treatment liquid is introduced into the preset recovery vessel 360 according to the kind of the treatment liquid supplied to the substrate W.

Unlike those described above, the elevation unit 360 may move the spin head 340, instead of the treatment container 320, upwards and downwards.

The ejection member 380 supplies the treatment liquid onto the substrate W. The injection member 380 has a nozzle support 382, a nozzle 384, a support shaft 386, and a driver 388. The lengthwise direction of the support shaft 386 is provided along the third direction 16, and the driver 388 is coupled to a lower end of the support shaft 386. The driver 388 rotates and elevates the support shaft 386. The nozzle support 382 is coupled to an end of the support shaft 386, which is opposite to an end of the support shaft 386 coupled to the driver 388, perpendicularly to the support 386. The nozzle 384 is installed on a bottom surface of an end of the nozzle support 382. The nozzle 384 is moved to a process location and a standby location by the driver 388. The process location is a location at which the nozzle 384 is arranged at a vertical upper portion of the treatment container 320, and the standby location is a location that deviates from the vertical upper portion of the treatment container 320. One or a plurality of ejection members 380 may be provided. When a plurality of ejection members 380 are provided, the chemical, the rinsing liquid, and the organic solvent may be provided through different ejection members 380. The chemical may be a liquid having a strong acid or alkali property. The rinsing liquid may be pure water. The organic solvent may be a mixture of vapor of isopropyl alcohol and an inert gas or a isopropyl alcohol liquid.

Figure 3:
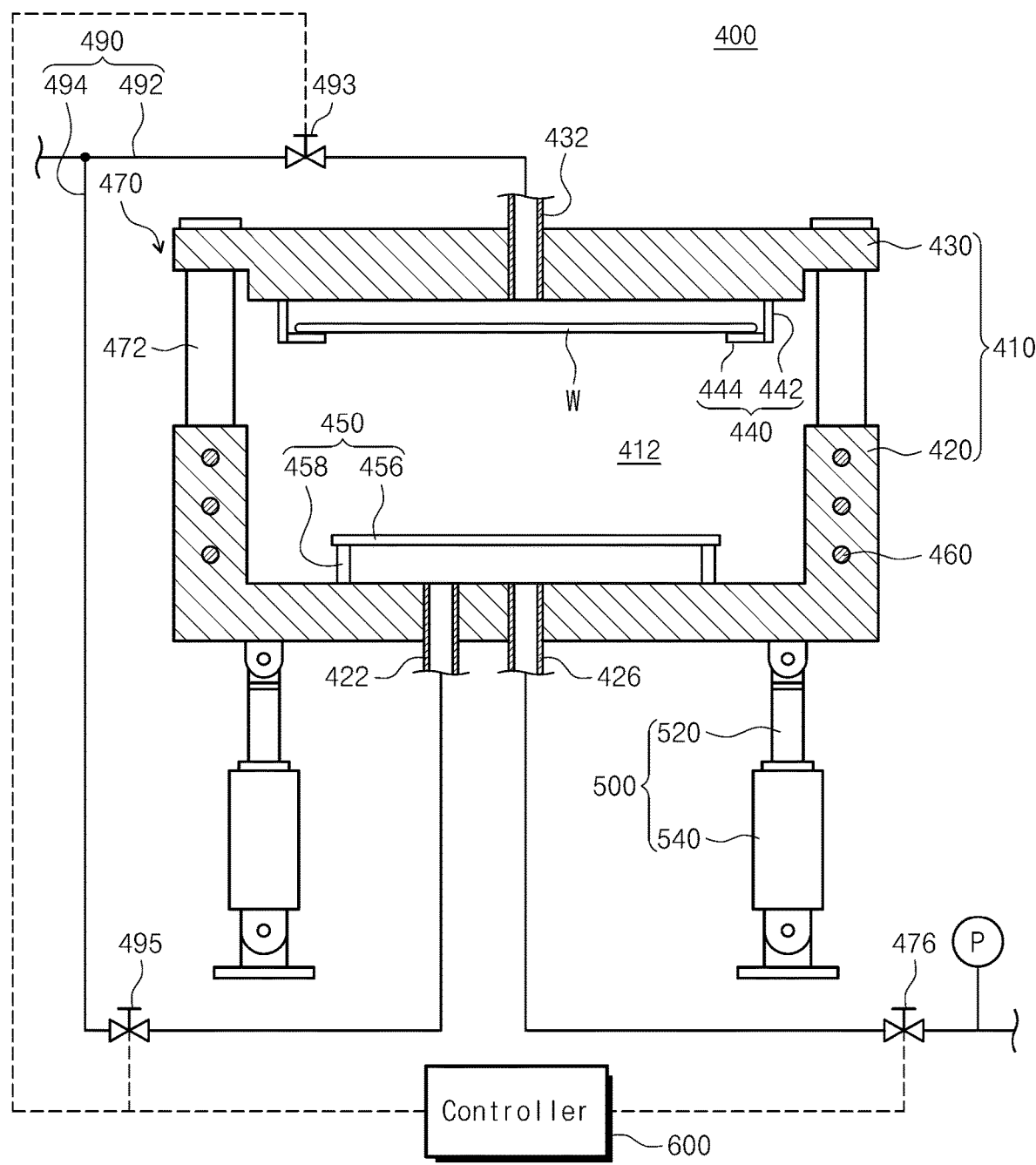
FIG. 3 is a sectional view schematically illustrating an apparatus for drying a substrate in a second process chamber of FIG. 1.

A substrate treating apparatus 400 for performing a substrate drying process is provided in the second process chamber. The substrate treating apparatus 400 secondarily dries the substrate W liquid-treated in the first process chamber. According to an embodiment, the substrate W is carried into the second process chamber 400 in a state in which a large amount of an organic solvent stays on an upper surface of the substrate W. The substrate treating apparatus 400 may dry the substrate W by using a supercritical solvent. FIG. 3 is a sectional view illustrating an apparatus for drying a substrate in a second process chamber of FIG. 1. Referring to FIG. 1, the substrate treating apparatus 400 includes a chamber 410, a body elevating member 470, a substrate support unit 440, a blocking member 450, a heating member 460, a fluid supply unit 490, a conversion unit, and a controller.

The chamber 410 defines a treatment space 412 for treating the substrate W therein. The chamber 410 closes the treatment space 412 from the outside while the substrate W is treated. The chamber 410 includes a lower body 420 and an upper body 430. The lower body 420 has an open-topped cup shape. A lower supply port 422 and an exhaustion port 426 are formed on a bottom surface of an inside of the lower body 420. When viewed from the top, the lower supply port 422 may deviate from a central axis of the lower body 420. The lower supply port 422 functions as a passage, through which the supercritical fluid is supplied to the treatment space 412.

The upper body 430 is combined with the lower body 420 to define a treatment space 412 therebetween. The upper body 430 is located above the lower body 420. The upper body 430 has a plate shape. An upper supply port 432 is formed in the upper body 430. The upper supply port 432 functions as a passage, through which the supercritical fluid is supplied to the treatment space 412. The upper supply port 432 may be located to coincide with the center of the upper body 430. A lower end of the upper body 430 may face an upper end of the lower body 420 at a location at which the central axis of the upper body 430 coincides with the central axis of the lower body 420. According to an example, the upper body 430 and the lower body 420 are formed of a metallic material.

The body elevating member 470 adjusts a relative height of the upper body 430 and the lower body 420. The body elevating member 470 moves one of the upper body 430 and the lower body 420 upwards and downwards. It is described in the embodiment that a location of the upper body 430 is fixed and a distance between the upper body 430 and the lower body 420 is adjusted by moving the lower body 420. The body elevating member 470 elevates the lower body 420 to open or close the treatment space 412. The body elevating member 470 moves the lower body 420 such that a relative location of the upper body 430 and the lower body 420 may have a closing location and an opening location. Here, the closing location is a location at which the upper body 430 and the lower body 420 are closely attached to each other to contract each other, and the opening location is a location at which the upper body 430 and the lower body 420 are spaced apart from each other such that the substrate is carried in and out. The body elevating member 470 includes a plurality of elevation shafts 452 that connects the upper body 430 and the lower body 420. The elevation shafts 452 are located between an upper end of the lower body 420 and the upper body 430. The elevation shafts 452 are arranged along a periphery of an upper end of the lower body 420. The elevation shafts 452 may pass through the upper body 430 to be fixedly coupled to an upper end of the lower body 420. As the elevation shafts 452 is lifted or lowered, the height of the lower body 420 is changed and a distance between the upper body 430 and the lower body 420 may be adjusted. For example, the elevation shafts 452 may be lifted and lowered by a cylinder.

Optionally, the substrate support unit 440 installed in the fixed lower body 420, and the upper body 430 may be moved.

Figure 4:
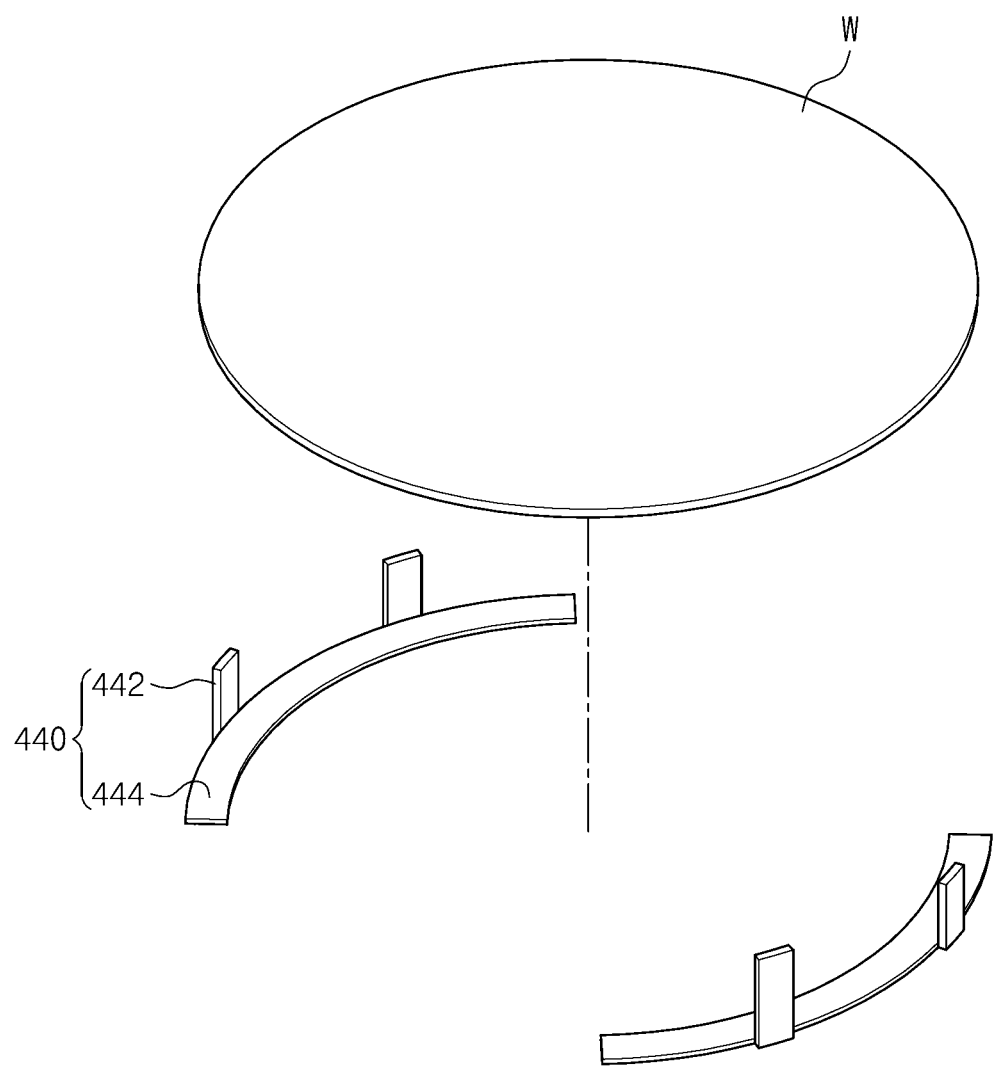
FIG. 4 is a perspective view of a substrate support unit of FIG. 3.
Figure 5:
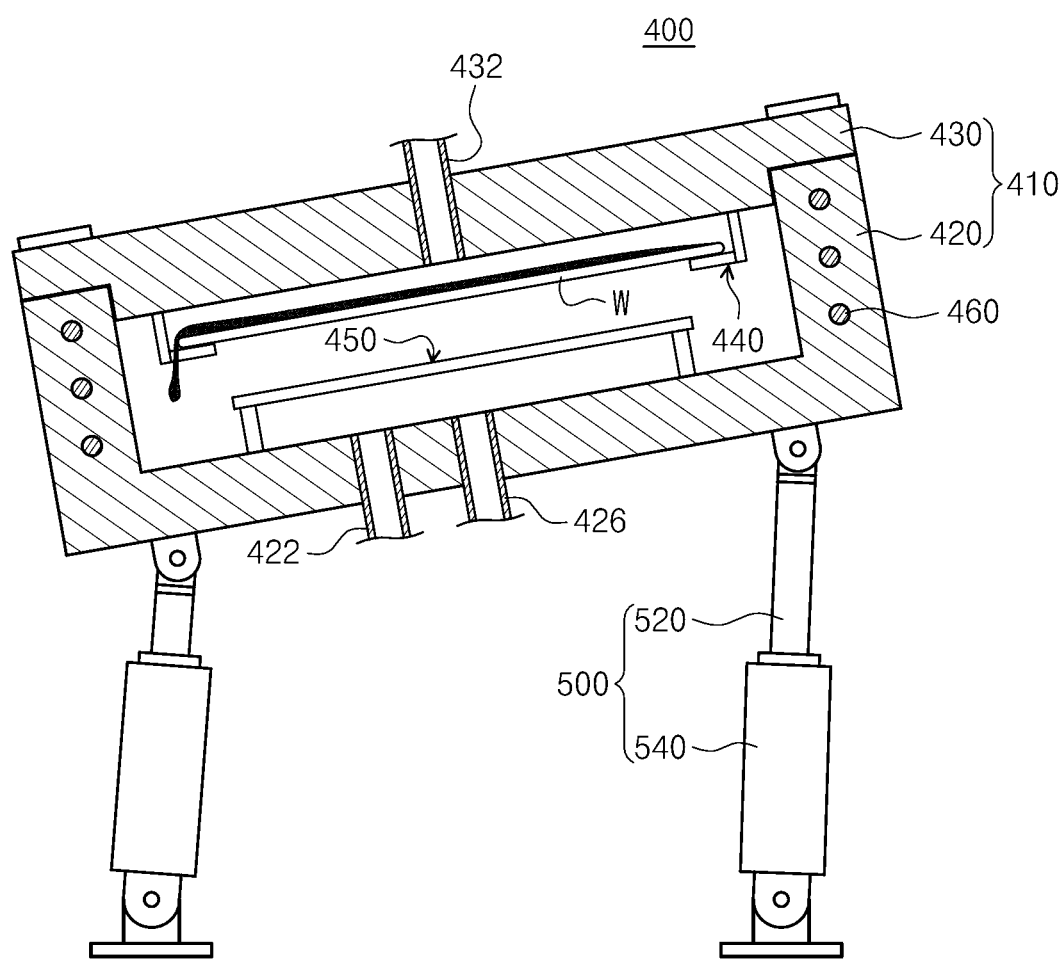
FIG. 5 is a view illustrating that the substrate of FIG. 3 is converted into an inclined state.
Figure 6:
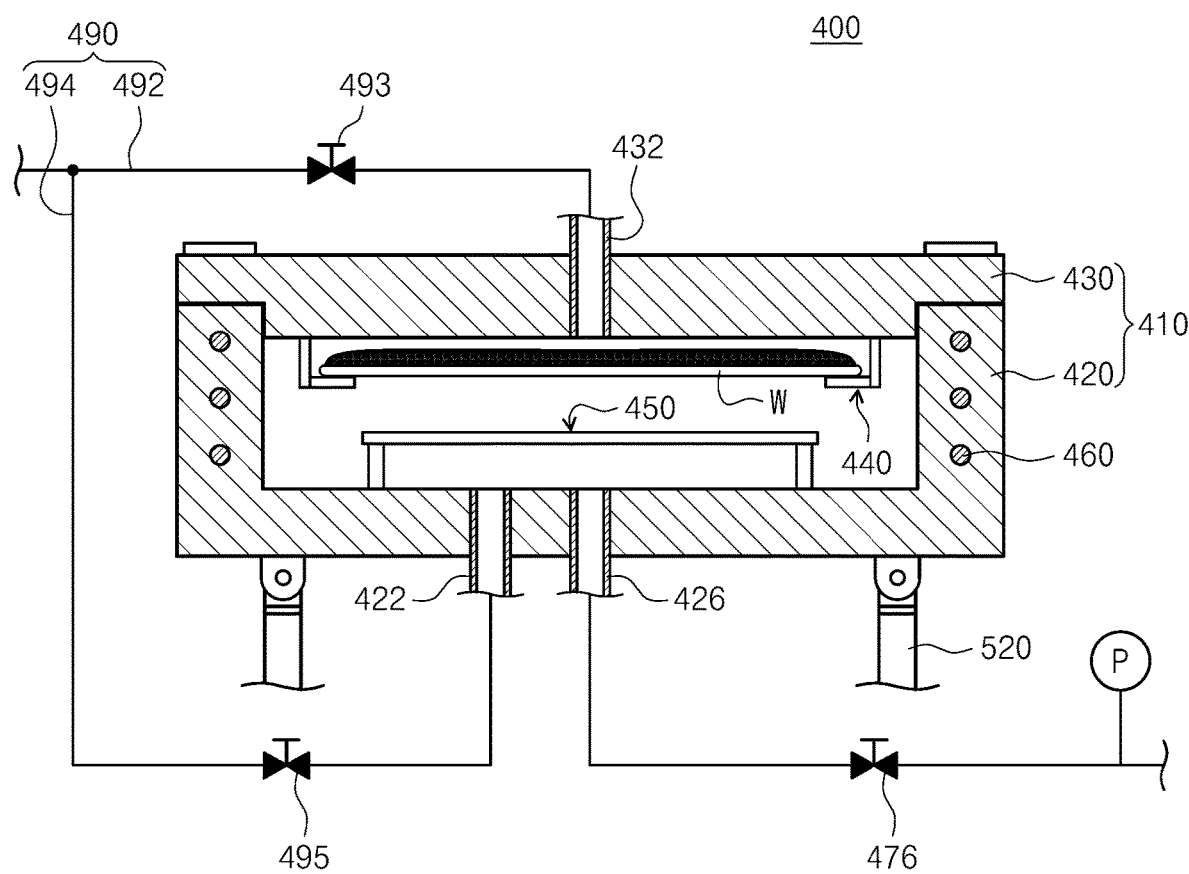
FIGS. 6 to 9 are views illustrating a process of treating a substrate by using the apparatus of FIG. 3.
Figure 7:
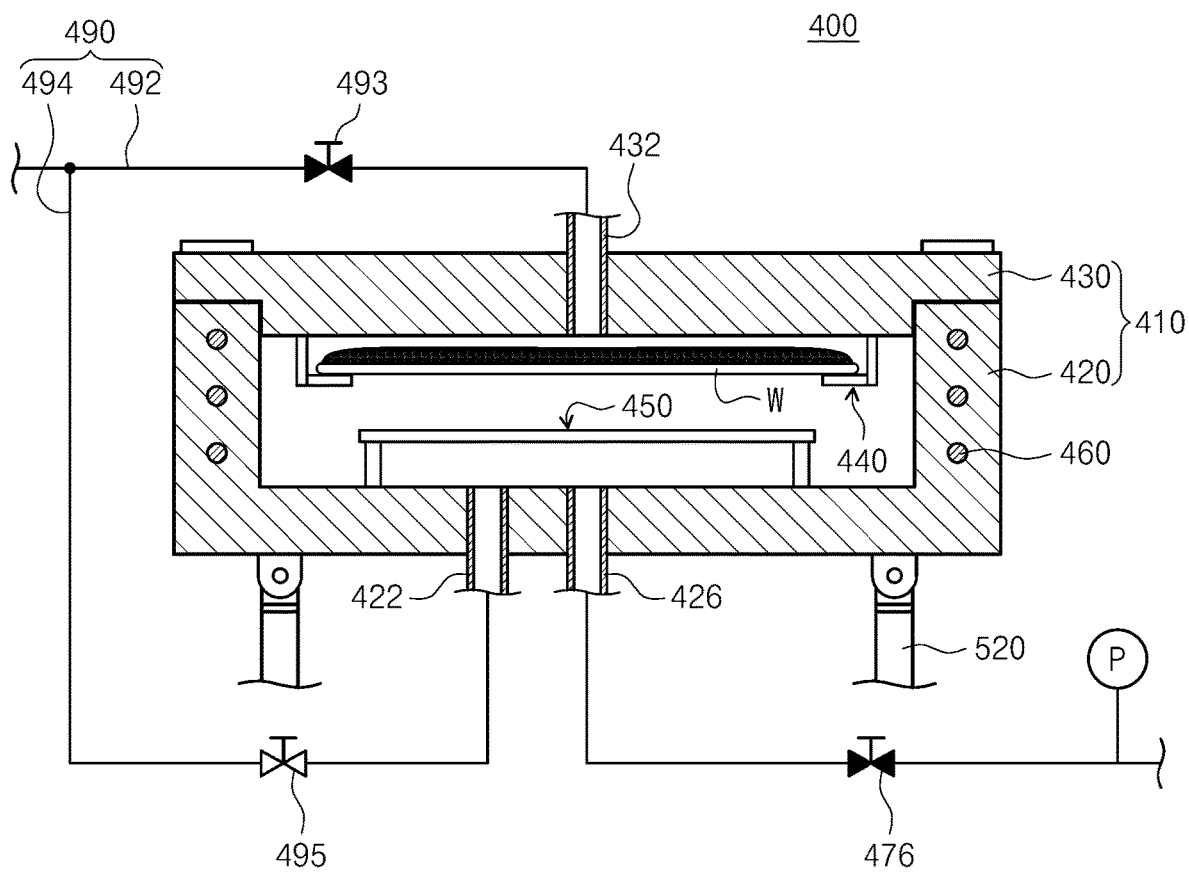
Figure 8:
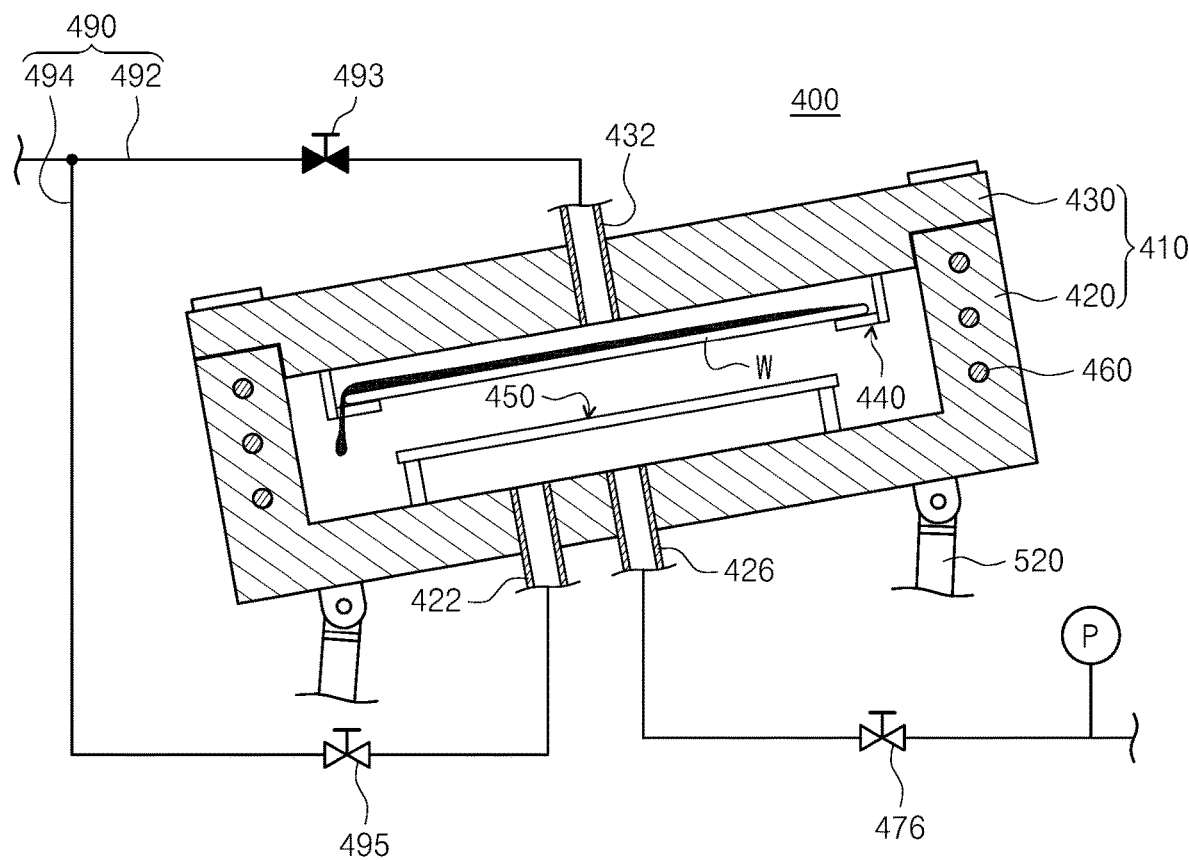
Figure 9:
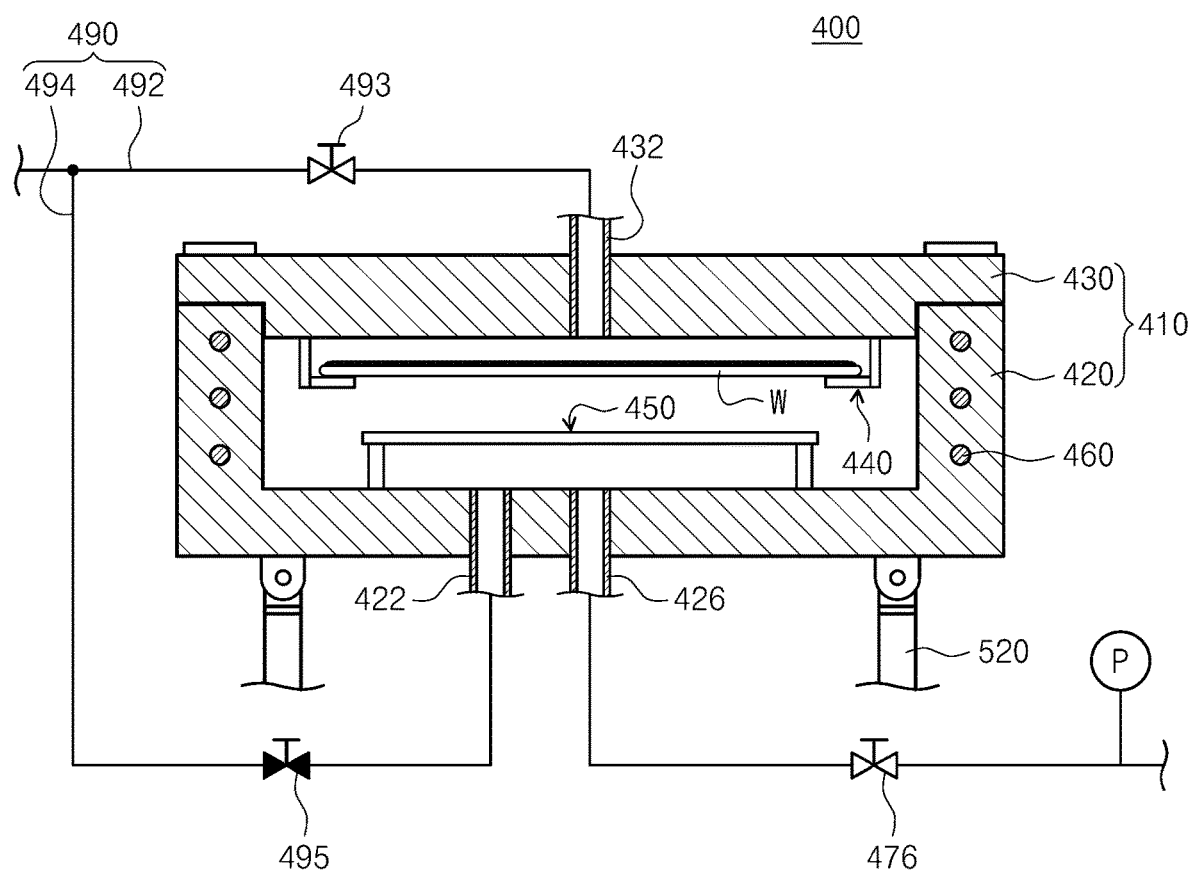

The substrate supporting unit 440 supports the substrate W in the treatment space 412. The substrate support unit 440 supports the substrate W such that a treatment surface of the substrate W faces the upper side. The substrate support unit 440 includes a vertical member and a horizontal member. FIG. 4 is a perspective view illustrating a substrate support unit of FIG. 3. Referring to FIG. 4, the vertical member includes a plurality of vertical supports 442. The vertical support 442 has a bar shape that extends downwards from a ceiling surface of the upper body 430. For example, four vertical supports 442 may be provided. When viewed from the top, the vertical supports 442 may be located to surrounding the upper supply port 432.

A horizontal support 444 has an arc shape. The horizontal support 444 extends from lower ends of the vertical supports 442 in a direction that is perpendicular to the vertical supports 442. A peripheral area of the substrate W is positioned on upper surfaces of the vertical supports 442.

Referring to FIG. 3 again, the blocking member 450 includes a blocking plate 456 and a lower support 458. The blocking plate 456 is located between the lower supply port 422 and the substrate support unit 440 in the treatment space 412. The blocking plate 456 has a disk shape. The blocking plate 456 has a diameter that is smaller than an inner diameter of the lower body 420. When viewed from the top, the blocking plate 456 has a diameter by which both of the lower supply port 422 and the exhaustion port 426 are covered. Accordingly, a flow path of the treatment fluid supplied from the lower supply port 422 is detoured by the blocking plate 456. That is, the blocking plate 456 prevents the supercritical fluid supplied from the lower supply port 422 from being directly supplied to a non-treatment surface of the substrate W. For example, the blocking plate 456 may correspond to the diameter of the substrate W or have a larger diameter. The lower support 458 supports the blocking plate 456. A plurality of lower supports 458 are provided to be arranged along a circumferential direction of the blocking plate 456. The lower supports 458 are arranged to be spaced apart from each other by a specific interval.

The heating member 460 heats the treatment space 412. The heating member 460 heats the supercritical fluid supplied to the treatment space 412 to a critical temperature or higher to maintain a phase of the supercritical fluid. The heating member 460 may be buried and installed in at least one wall of the upper body 430 and the lower body 420. For example, the heating member 460 may be a heater 460 that receive electric power from the outside to generate heat.

The fluid supply unit 490 supplies a drying fluid to the treatment space 412. The drying fluid is supplied in a supercritical state by a supercritical temperature and a supercritical pressure. The fluid supply unit 490 includes an upper supply line 492 and a lower supply line 494. The upper supply line 492 is connected to the upper supply port 432. The drying fluid is supplied to the treatment space 412 sequentially via the upper supply line 492 and the upper supply port 432. An upper valve 493 is installed in the upper supply line 492. The upper valve 493 opens and closes the upper supply line 492. The lower supply line 494 connects the upper supply line 492 and the lower supply port 422. The lower supply line 494 is branched from the upper supply line 492 and is connected to the lower supply port 422. That is, the drying fluids supplied from the upper supply line 492 and the lower supply line 494 may be the same kind of fluid. The drying fluid is supplied to the treatment space 412 sequentially via the lower supply line 494 and the lower supply port 422. A lower valve 494 is installed in the lower supply line 495. The lower valve 495 opens and closes the lower supply line 494.

According to an embodiment, a drying fluid may be supplied from a lower supply port 422 facing a non-treatment surface of the substrate W, and then the drying fluid may be supplied from an upper supply port 432 facing a treatment surface of the substrate W. Accordingly, the drying fluid may be supplied to the treatment space 412 through the lower supply line 494, and then may be supplied to the treatment space 412 through the upper supply line 492. This is because the initially supplied drying fluid may be prevented from being supplied to the substrate W while not reaching a threshold pressure or a threshold temperature.

The conversion unit 500 converts the state of the substrate W. The conversion unit 500 converts the substrate W into a horizontal state and an inclined state. In the inclined state, the substrate W is provided to be inclined at a specific angle with respect to a horizontal surface as in FIG. 5. The specific angle may be an angle that is larger than 0. According to an embodiment, the specific angle may be 15 to 90 degrees. The conversion unit 500 converts the state of the substrate W by driving the chamber 410 and changing the state of the chamber 410. The conversion unit 500 includes a plurality of support shafts 520 and a driving member 540. The support shafts 520 support the lower body 420. The support shafts 520 support different areas of the lower body 420. The support shafts 520 has a cylindrical shape having a lengthwise direction facing a third direction. The support shafts 520 may be fixedly coupled to a bottom surface of the lower body 420. Some of the support shafts 520 are coupled to one area of the lower body 420, and some of the support shafts 520 are coupled to an opposite area of the lower body 420. The driving member 540 is coupled to some of the support shafts 520. According to an embodiment, the lengths of the some support shafts 520 may be changed by the driving member 540 or the some support shafts 520 may be moved vertically. Accordingly, an area and an opposite area of the chamber 410 may have different heights, and the state of the substrate W located in the chamber 410 may be converted. For example, the conversion unit 500 may be hinge-coupled to the chamber 410.

The controller 600 controls the conversion unit 500 and the fluid supply unit 490. The controller 600 controls the conversion unit 500 and the fluid supply unit 490 such that an atmosphere forming operation, a first liquid removing operation, and a second liquid removing operation may be sequentially performed.

The controller 600 may change the treatment space to a dry atmosphere by supplying the drying fluid into the treatment space in the atmosphere forming operation. For example, the dry atmosphere may be a supercritical atmosphere. Further, the controller 600 may remove a part of the liquid that stays on the substrate W by converting the substrate W into an inclined state in the first liquid removing operation. Further, the controller 600 may allow the drying fluid to directly remove the liquids left on the substrate W by supplying the drying fluid onto the substrate S in the second liquid removing operation.

Next, a process of drying a substrate W by using the above-described substrate treating apparatus 400 will be described. FIGS. 6 to 9 are views illustrating a process of treating a substrate by using the apparatus of FIG. 3; Referring to FIGS. 6 to 9, the method for drying a substrate W includes an operation of carrying a substrate in, an atmosphere forming operation, a first liquid removing operation, and a second liquid removing operation. The operation of carrying the substrate in, the operation of forming an atmosphere, the first liquid removing operation, and the second liquid removing operation are sequentially performed.

Prior to the description of the operations, the substrate W dried by the substrate treating apparatus 400 is a substrate W on which a liquid treating process has been completely performed in the first process chamber 410, and is carried while an organic solvent is remained. The substrate W is maintained in a wet state. The organic solvent may be an isopropyl alcohol liquid. According to an embodiment, the amount of the organic solvent is larger, and the substrate W is carried while a large amount of the organic solvent is remained. This prevents a pattern leaning phenomenon from being generated as the organic solvent is naturally dried while the substrate W is carried.

If the substrate carrying operation is performed, the lower body 420 is moved to an opening location to open the treatment space 412. The main robot 244 carries the substrate W from the first process chamber 410 to the second process chamber 410. The substrate W is positioned on the substrate support unit 440. Thereafter, the lower body 420 is moved to a closing location, and the treatment space is sealed from the outside. Then, the substrate W is provided in the second process chamber 410 in a horizontal state.

In the atmosphere forming operation, the drying fluid is supplied form the lower supply port 422 into the treatment space. The drying fluid is supplied into the treatment space 412 in a supercritical state, and a supercritical atmosphere is formed in the treatment space. If the supercritical atmosphere is formed in the treatment space 412, the first liquid removing operation of removing the organic solvent that stays on the substrate W is performed.

In the first liquid removing operation, the state of the substrate W is converted from a horizontal state to an inclined state. In the first liquid removing operation, the state of the chamber 410 is changed to an inclined state and accordingly, the state of the substrate W is also converted to an inclined state. Some of the organic solvents that stay on the substrate W flows down from a surface of the substrate W as the substrate W is inclined. If a specific time elapses, the state of the substrate W is converted to a horizontal state and the second liquid removing operation is performed.

In the second liquid removing operation, the drying fluid is supplied from the upper supply port 432 to the treatment space 412. The drying fluid is provided in the treatment space 412 in a supercritical state, and the supercritical fluid is directly supplied onto the upper surface of the substrate W. The organic solvent that stays on the substrate W is dried by the supercritical solvent.

According to the present embodiment, a total time that is taken to dry the substrate W may be shortened by inclining the substrate W to remove a part of the liquid that stays on the substrate W.

Figure 10:
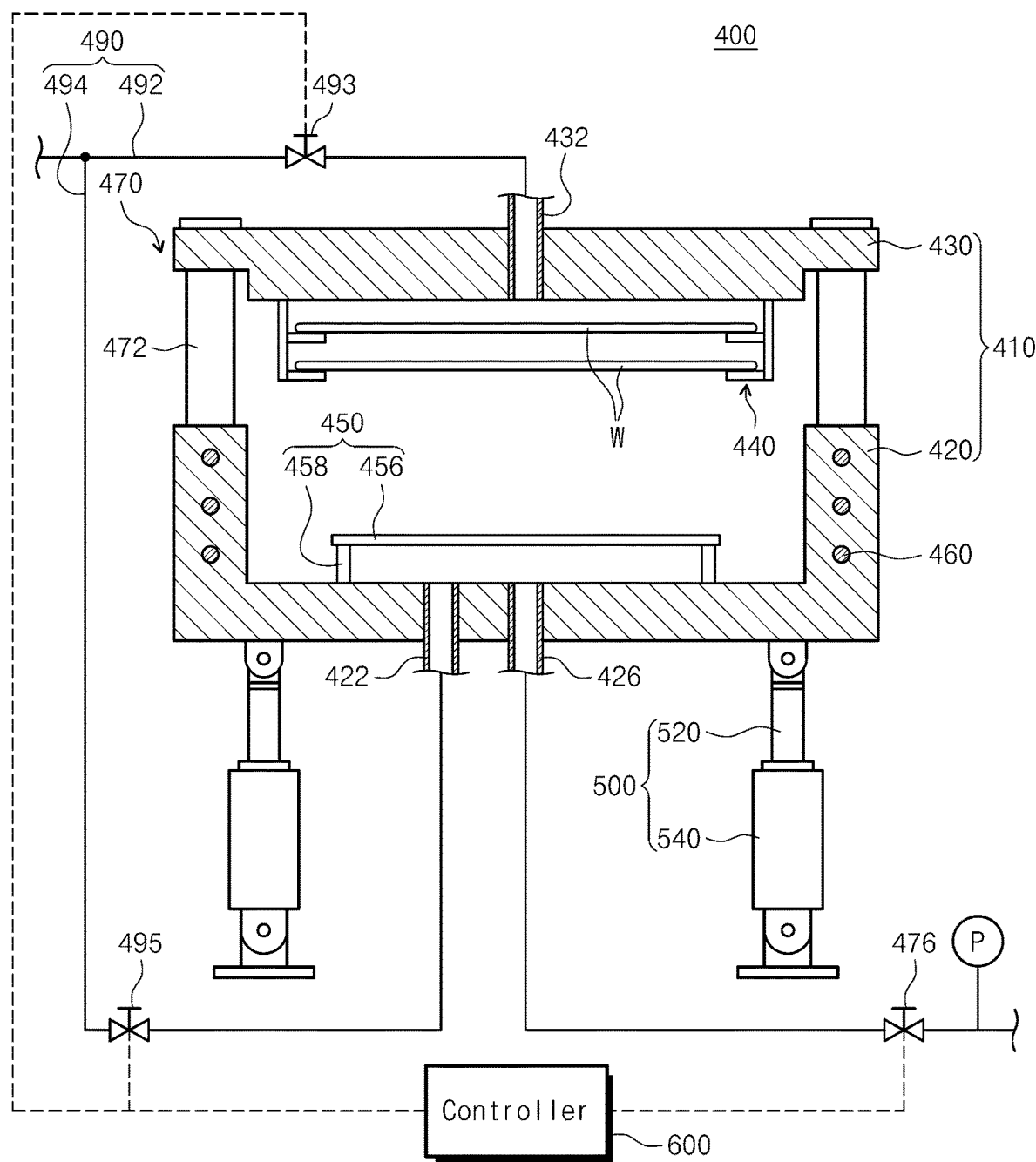
FIG. 10 is a sectional view illustrating another embodiment of the apparatus of FIG. 3.
Figure 11:
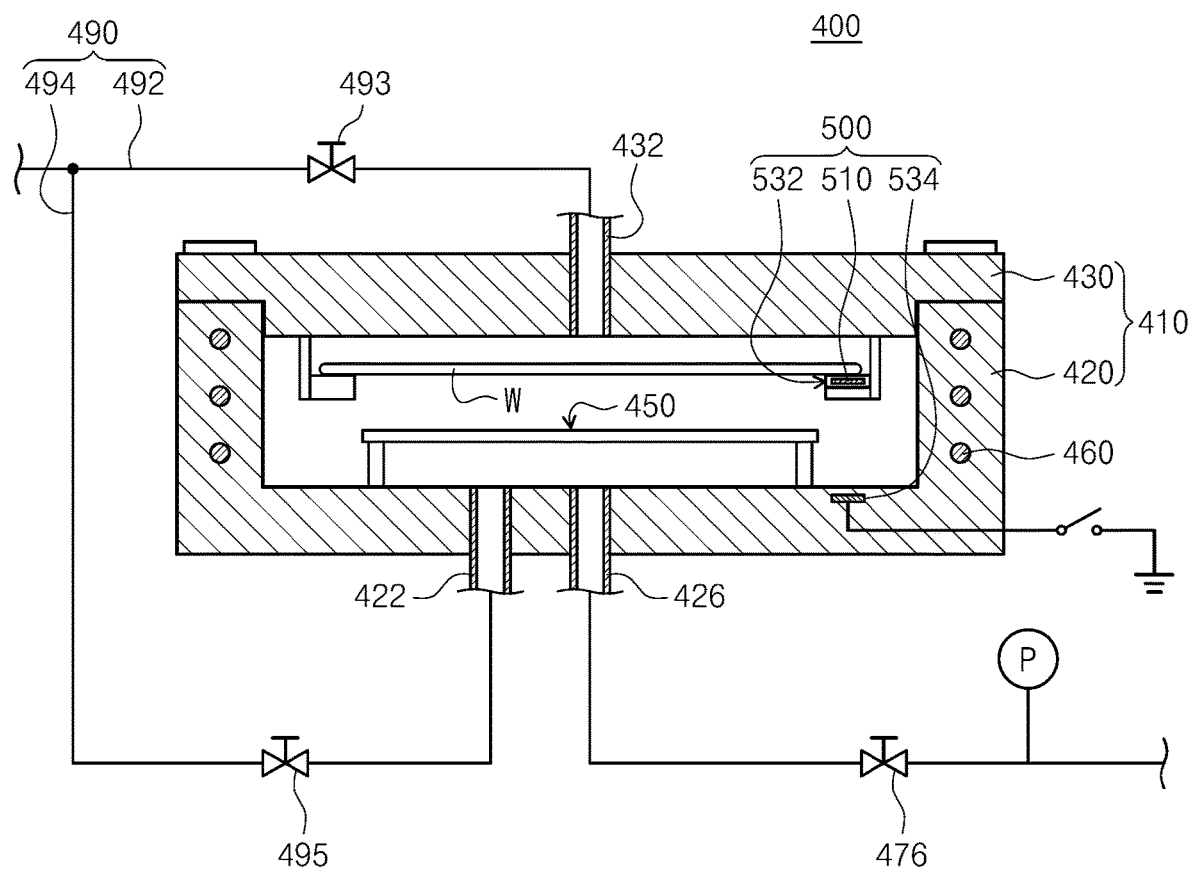
FIG. 11 is a sectional view illustrating another embodiment of a conversion unit of FIG. 3.
Figure 12:
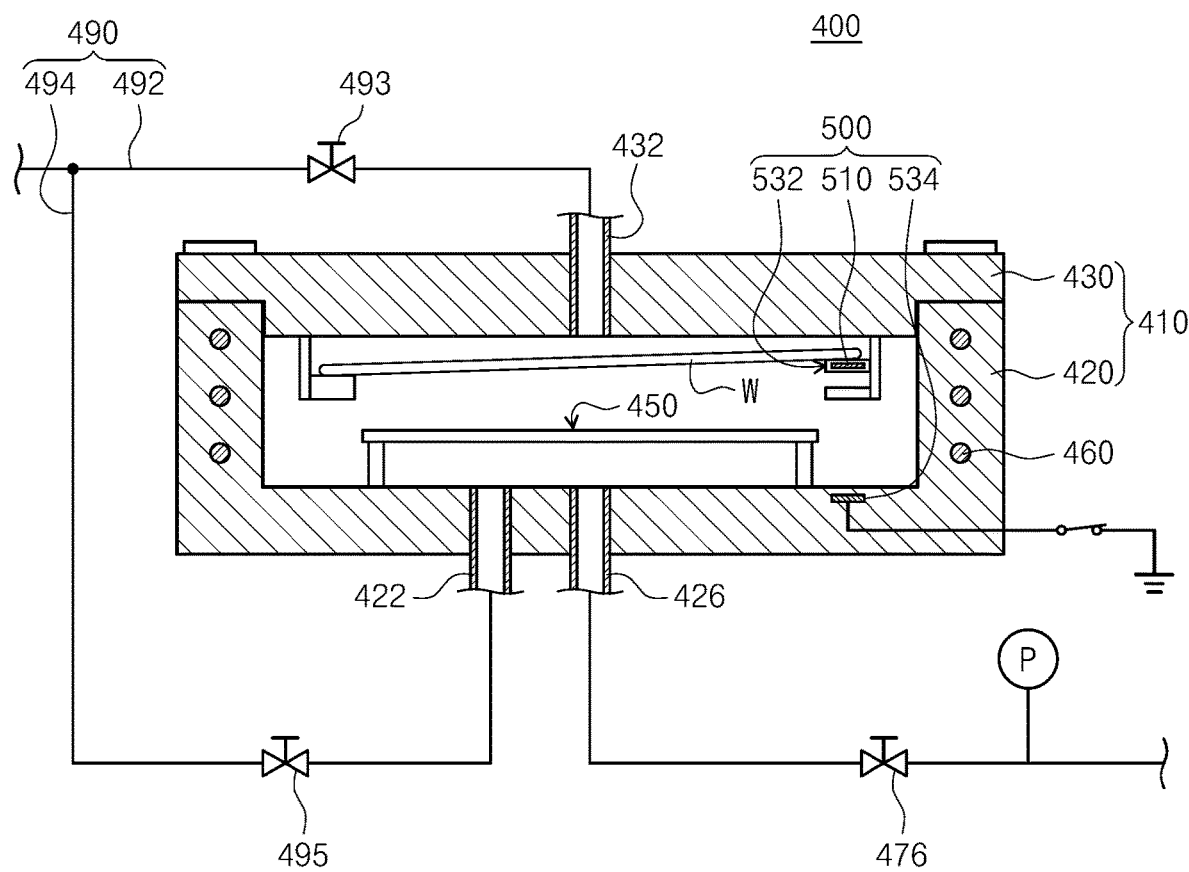
FIG. 12 is a sectional view illustrating a state in which the substrate is converted into an inclined state by the conversion unit of FIG. 11.

According to another embodiment of the inventive concept, a plurality of substrate W may be located in the treatment space as in FIG. 10. The substrate support unit 440 may include a plurality of horizontal supports 444. The horizontal supports 444 extend from the vertical support 442 inwards, and may be located at different heights. The plurality of substrates W may be supported by the horizontal supports 444 located at different heights.

Further, according to another embodiment of the inventive concept, the state of the substrate W may be converted while the location of the chamber 410 is fixed. As in FIGS. 11 and 12, the conversion unit 500 may include a guide 510, an upper magnetic member 532, and a lower magnetic member 534. The guide 510 is located on an upper surface of the horizontal support 444, on which the substrate W is positioned. The guide 510 may be provided to only one of the two horizontal supports 444 that face each other. Accordingly, one side of the substrate W may be supported by the guide 510, and an opposite side of the substrate W may be supported by the horizontal support 444. The areas of the guide 510 and the horizontal support 444, on which the substrate W is positioned, may have the same height. In the vertical supports 442, the rail of the guide 510 is installed along a vertical direction, and the guide 510 may be elevated along a lengthwise direction of the rail of the guide 510. The upper magnetic member 532 is provided in the guide 510. The upper magnetic member 532 may be a magnet. The lower magnetic member 534 may be located below the upper magnetic member 532 to face the upper magnetic member 532. The lower magnetic member 534 may be provided in the lower body 420. The lower magnetic member 534 may be an electromagnet. If a current is supplied to the lower magnetic member 534, a repulsive force is generated between the lower magnetic member 534 and the upper magnetic member 532, and the guide 510 may be elevated. Accordingly, one side of the substrate W may be located to be higher than an opposite side of the substrate W, and may be converted into an inclined state.

Unlike this, if the supply of the current to the lower magnetic member 534 is interrupted, the guide 510 is moved downwards by the gravitational force and the substrate W may be converted into a horizontal state.

It has been described in the above-mentioned example that the process of drying the substrate W is performed by the supercritical fluid. However, unlike this, the process of drying the substrate W may be performed by using a drying gas in addition to the supercritical fluid.

Further, it has been described as an example that the process of liquid-treating a substrate W and the process of drying a substrate W are performed in different chambers 410. However, according to the inventive concept, the liquid-treating process and the drying process may be performed in a single chamber 410.

According to the embodiment of the inventive concept, because a part of the liquid that stays on the substrate may be made to flow down by converting the state of the substrate into an inclined state and the remaining liquid that stays on the substrate is removed by using the drying fluid later, a time for drying the substrate may be shortened.

Further, according to the embodiment of the inventive concept, the state of the substrate into an inclined state is performed in a supercritical atmosphere. Accordingly, a pattern may be prevented from being leaned while the staying liquid flows down.

What is claimed is:

1. An apparatus for drying a substrate using a supercritical fluid, the apparatus comprising:
    a chamber having a treatment space in the interior thereof;
    a substrate support unit configured to support the substrate in the treatment space;
    a conversion unit configured to convert a state of the substrate supported by the substrate support unit between a horizontal state and an inclined state;
    a fluid supply unit configured to supply a drying fluid into the treatment space; and
    a controller configured to control the conversion unit and the fluid supply unit,
    wherein the controller controls the conversion unit and the fluid supply unit to perform:
        a first liquid removing operation of allowing a part of a liquid that stays on the substrate to flow down from the substrate by converting the state of the substrate to an inclined state if the substrate is carried into the substrate support unit in the treatment space; and
        a second liquid removing operation of allowing the remaining part of the liquid that stays on the substrate to be removed by supplying the drying fluid into the treatment space,
    wherein the controller controls the fluid supply unit to supply the drying fluid in a supercritical state in the treatment space in the second liquid removing operation,
    wherein the controller controls the conversion unit to provide the substrate in a horizontal state in the second liquid removing operation, and
    wherein the liquid is organic solvent.

2. The apparatus of claim 1, wherein the controller controls the fluid supply unit to further perform:
    an atmosphere forming operation of forming the treatment space into a supercritical atmosphere by supplying the drying fluid into the treatment space before the first liquid removing operation, and
    wherein the drying fluid is in a supercritical state in the treatment space in the atmosphere forming operation.

3. The apparatus of claim 1, wherein the conversion unit converts a state of the substrate by changing a state of the chamber between the horizontal state and the inclined state.

4. The apparatus of claim 1,
    wherein the substrate support unit includes:
        a plurality of vertical supports that extend downwards from a ceiling surface of the chamber; and
        a plurality of horizontal supports that extend inwards from the vertical supports and are located at different heights to support a plurality of substrates individually.

5. The apparatus of claim 1, wherein the conversion unit converts the state of the substrate between the horizontal state and the inclined state by generating a magnetic force.

6. An apparatus for drying a substrate, the apparatus comprising:
a chamber having a treatment space in the interior thereof;
a substrate support unit configured to support the substrate in the treatment space;
a conversion unit configured to convert a state of the substrate supported by the substrate support unit between a horizontal state and an inclined state;
a fluid supply unit configured to supply a drying fluid into the treatment space; and
a controller configured to control the conversion unit and the fluid supply unit,
wherein the conversion unit converts the state of the substrate between the horizontal state and the inclined state by generating a magnetic force, wherein the conversion unit includes:
a guide located in the substrate support unit and configured to support one side of the substrate;
an upper magnetic member provided in the guide; and
a lower magnetic member provided in the chamber and located below the upper magnetic member, and
wherein the guide is elevated by a magnetic force generated between the upper magnetic member and the lower magnetic member.

7. The apparatus of claim 1, wherein the conversion unit is hinge-coupled to the chamber.

* * * * *